United States Patent
Falguier et al.

(10) Patent No.: US 10,056,801 B2
(45) Date of Patent: Aug. 21, 2018

(54) PROTECTIVE COVER FOR A ROTATING ELECTRIC MACHINE FOR A MOTOR VEHICLE

(71) Applicant: Valeo Equipements Electriques Moteur, Creitel (FR)

(72) Inventors: Manuel Falguier, Champigny sur Marne (FR); Fabien Guerin, Chatillon (FR); Alexis Hosni, Chelles (FR); Michel Fakes, Seclin (FR); Yannick Le-Meitour, Châtenay Malabry (FR); Philippe Baudesson, La Boissiere (FR)

(73) Assignee: Valeo Equipements Electriques Moteur, Creteil (FR)

( * ) Notice: Subject to any disclaimer, the term of this patent is extended or adjusted under 35 U.S.C. 154(b) by 190 days.

(21) Appl. No.: 14/917,446

(22) PCT Filed: Sep. 3, 2014

(86) PCT No.: PCT/FR2014/052180
§ 371 (c)(1),
(2) Date: Mar. 8, 2016

(87) PCT Pub. No.: WO2015/033064
PCT Pub. Date: Mar. 12, 2015

(65) Prior Publication Data
US 2016/0226334 A1  Aug. 4, 2016

(30) Foreign Application Priority Data
Sep. 9, 2013 (FR) ...................... 13 58623

(51) Int. Cl.
*H02K 5/20* (2006.01)
*H02K 11/33* (2016.01)
(Continued)

(52) U.S. Cl.
CPC ................. *H02K 5/20* (2013.01); *H02K 9/02* (2013.01); *H02K 11/048* (2013.01); *H02K 11/33* (2016.01); *H05K 7/20909* (2013.01)

(58) Field of Classification Search
CPC ........ H02K 11/048; H02K 11/33; H02K 5/20; H02K 9/02; H05K 7/20909
(Continued)

(56) References Cited

U.S. PATENT DOCUMENTS 4,418,295 A * 11/1983 Shiga ...................... H02K 9/06
                                                     310/263
4,926,076 A *  5/1990 Nimura ................... H02K 5/04
                                                      310/58

(Continued)

FOREIGN PATENT DOCUMENTS

DE    10 2011 084643 A1    4/2013
EP     1 032 114 A1         8/2000
(Continued)

OTHER PUBLICATIONS

International Search Report issued in PCT/FR2014/052180 dated Nov. 3, 2014 (3 pages).
(Continued)

*Primary Examiner* — Alex W Mok
(74) *Attorney, Agent, or Firm* — Osha Liang LLP

(57) ABSTRACT

The present invention concerns a protective cover (400) designed to cover power, filtering and control modules of an electronic assembly for a rotating electric machine for a motor vehicle. Said protective cover (400) is characterised in that it comprises:—openings (401, 402, 403, 404) designed to generate different cooling air streams (F1, F2, F3, F4) for heat dissipation requirements of each of the power, control and filtering modules;—the openings of the protective cover (400) being distributed into: a first set of openings (401)
(Continued)

designed to be positioned facing the fins of a first heat sink coupled to the power module; a second set of openings (402) designed to be positioned facing the control module; the two sets of openings (401, 402) being separated by a barrier wall (405) so as to create a first radial cooling air stream (F1) for said power module and a second radial cooling air stream (F2) for said control module; and a third set of openings (403) designed to be positioned facing the fins of a second heat sink coupled to condensers of the filtering module so as to create a third radial cooling air stream (F3) for said filtering module.

7 Claims, 14 Drawing Sheets

(51) Int. Cl.
    *H05K 7/20*         (2006.01)
    *H02K 9/02*         (2006.01)
    *H02K 11/04*       (2016.01)

(58) Field of Classification Search
    USPC .......................................................... 310/59
    See application file for complete search history.

(56) References Cited

U.S. PATENT DOCUMENTS

| | | | | |
|---|---|---|---|---|
| 5,996,337 | A * | 12/1999 | Blosser | F02D 41/0055 60/274 |
| 6,812,604 | B2 * | 11/2004 | Braun | H02K 11/046 310/52 |
| 7,171,973 | B2 * | 2/2007 | Orii | C03C 23/0075 134/148 |
| 7,723,875 | B2 * | 5/2010 | Fakes | H02K 5/20 310/58 |
| 8,225,608 | B2 * | 7/2012 | Wu | B60W 20/15 60/607 |
| 8,283,823 | B2 * | 10/2012 | Hsiao | H02K 5/20 310/88 |
| 2003/0178899 | A1 | 9/2003 | Aeschlimann et al. | |
| 2005/0253457 | A1 * | 11/2005 | Pierret | F02N 11/04 307/10.1 |
| 2006/0181162 | A1 * | 8/2006 | Pierret | H02K 9/20 310/58 |
| 2007/0105379 | A1 * | 5/2007 | Orii | C03C 23/0075 438/689 |
| 2007/0105380 | A1 * | 5/2007 | Orii | C03C 23/0075 438/689 |
| 2010/0107632 | A1 * | 5/2010 | Wu | B60K 6/24 60/608 |
| 2013/0224050 | A1 * | 8/2013 | Nakagami | F01C 21/10 417/410.1 |
| 2014/0055574 | A1 * | 2/2014 | Kang | H04N 13/0214 348/49 |

FOREIGN PATENT DOCUMENTS

| | | |
|---|---|---|
| EP | 2 091 136 A1 | 8/2009 |
| FR | 2847085 A1 | 5/2004 |
| FR | 2923098 A1 | 5/2009 |

OTHER PUBLICATIONS

Written Opinion of the International Searching Authority issued in PCT/FR2014/052180 dated Nov. 3, 2014 (6 pages).

* cited by examiner

PROTECTIVE COVER FOR A ROTATING ELECTRIC MACHINE FOR A MOTOR VEHICLE

TECHNICAL FIELD OF THE INVENTION

The present invention relates to a protective cover suitable for covering power, filtering and control blocks of an electronic assembly for a rotary electric machine for a motor vehicle. The present invention relates also to a rotary electric machine comprising such a protective cover. The invention can be applied particularly but not exclusively in the field of motor vehicle starter alternators, for example for starter alternators or motor-generators suitable for use with vehicles of the mild hybrid type.

TECHNICAL BACKGROUND OF THE INVENTION

In a motor vehicle comprising a heat engine and a rotary electric machine such as a starter alternator, such a machine comprises, in a non-limiting manner:
- a rotor comprising an inductor in which an excitation current is conducted; and
- a stator comprising a multi-phase winding.

The starter alternator operates in motor mode or in generator mode.

This machine is referred to as being reversible.

In alternator mode, also referred to as generator mode, the machine makes it possible to transform a rotary movement of the rotor driven by the heat engine of the vehicle into an electric current induced in the phases of the stator. In this case a bridge rectifier connected to the phases of the stator makes it possible to rectify the induced sinusoidal current into a continuous current in order to supply consumers of the vehicle as well as a battery.

By contrast, in motor mode the electric machine acts as an electric motor making it possible to drive in rotation the heat engine of the vehicle via the rotor shaft. It makes it possible to transform the electrical energy into mechanical energy: In this case a converter makes it possible to transform a direct current originating from the battery into an alternating current in order to supply the phases of the stator in order to turn the rotor.

Control components are used in order to determine the operating mode of the rotary electric machine (motor mode or generator mode) via control signals.

The starter alternators that integrate a regenerative braking function and a function of heat engine acceleration assistance, referred to as mild hybrid starter alternators, also integrate filtering components that prevent the power components from interfering with the electrical network of the motor vehicle, generally a network of 48 volts. These reversible machines have powers of approximately 8 to 15 kW.

The power components (bridge rectifier and converter), the control components and also the filtering components generate heat. It is thus necessary to use a cooling device in order to dissipate this heat emitted by all these components.

Patent FR2847085 describes an electronic assembly comprising the power components and the control components (referred to as control units), the two sets of components being placed as close as possible to one another, and a cooling device for cooling this assembly. The cooling device comprises:
- a dissipator on which the power and control components are mounted, the dissipator being arranged on the rear bearing of the electric machine and comprising fins on its lower face, which faces the bearing. In addition, there is a free space between the rotation shaft of the rotor and the dissipator, through which space air can circulate;
- the rear bearing comprising radial air outlet holes; and
- a protective cover comprising openings arranged on the top of said cover.

Thus, some of the air is sucked laterally into the starter alternator and flows towards the radial outlet holes of the bearing, while sweeping over the fins of the dissipator, and the remaining air is sucked through the openings in the cover and then flows axially along the rotation shaft (via the free space) of the rotor so as to join a flow passage below the dissipator. Thus, the assembly of power and control components is cooled.

One disadvantage of this prior art lies in the fact that it does not offer any solution for thermal decoupling between the different blocks of electronic components in relation to their own dissipation needs. Now, in the context of the "mild-hybrid" application, a thermal decoupling must be effected notably between the power components and the filtering components. This is because the power components can reach operating temperatures which can be dangerous for the filtering components and consequently damage them.

In this context, the object of the present invention is to overcome the above-mentioned disadvantage.

GENERAL DESCRIPTION OF THE INVENTION

To this end, the invention proposes a protective cover suitable for covering power, filtering and control blocks of an electronic assembly for a rotary electric machine for a motor vehicle, wherein said protective cover comprises:
- openings suitable for generating different flows of cooling air for thermal dissipation needs of each of the power, control and filtering blocks;
- the openings of the protective cover being divided into:
- a first set of openings suitable for being positioned facing the fins of a first dissipator coupled to the power block;
- a second set of openings suitable for being positioned facing the control block;
- the two sets of openings being separated by a separating low wall so as to create a first radial flow of cooling air for said power block and a second radial flow of cooling air for said control block; and
- a third set of openings that can be positioned facing the fins of a second dissipator coupled to capacitors of the filtering block so as to create a third radial flow of cooling air for said filtering block.

In accordance with another particular feature, the fins of the first dissipator, the protective cover and the openings of the first set are arranged in such a way as to satisfy the following relationships:

$$h \geq 0.5 \cdot ha$$

$$H < 0.5 \cdot ha, \text{ and}$$

$$D \geq 0.5 \cdot (d^2 - ((o-e)/2)^2)^{1/2},$$

where h is the height of an opening of the protective cover, ha is the height of a fin of the first dissipator, H is the distance between the bottom of the protective cover and the bottom of an opening, D is the distance between the inner edge of the protective cover and the leading edge of a fin of the first dissipator, d is an inter-fin space separating two adjacent fins of the first dissipator, o is the width of an opening and e is the thickness of a fin.

Thus, by virtue of the various openings dedicated to the various blocks and by virtue of the coupling of some openings with dedicated dissipators, the protective cover makes it possible to provide cooling adapted and optimized for the thermal dissipation needs of each block of components (power, control, filtering) thanks to the creation of specific flows of air for cooling each block.

In accordance with non-limiting embodiments, the protective cover may also comprise one or more additional features selected from the following:

the openings of the first set of openings, of the second set of openings and of the third set of openings of the protective cover are lateral, and the openings of the first set of openings and of the second set of openings are arranged in line with the fins of the first dissipator.

the protective cover also comprises a fourth set of openings that are arranged on the top of said cover and that can be positioned above capacitors of the filtering block so as to create a fourth axial flow of cooling air for the filtering block.

Also proposed is a rotary electric machine comprising:
a rotor;
a stator coupled to said rotor and comprising a plurality of phases;
an electronic assembly comprising:
 a power block, a filtering block and a control block, said power block of said electronic assembly being able to be connected to the phases of said stator, and
 a protective cover as described briefly above;
a rear bearing supporting said stator; and
a fan situated in proximity to the rear bearing.

In accordance with a non-limiting embodiment, said rotary electric machine is a starter alternator.

In accordance with a non-limiting embodiment, said starter alternator comprises a regenerative braking function and an acceleration assistance function.

BRIEF DESCRIPTION OF THE FIGURES

The invention and different applications thereof will be better understood upon reading the following description and examining the accompanying figures.

FIG. 1b shows an assembled perspective view of the electronic assembly of FIG. 1a;

DESCRIPTION OF EMBODIMENTS OF THE INVENTION

Elements that are identical, either in structure or in function, appearing in different figures will keep the same reference signs, unless specified otherwise.

The electronic assembly 10 for a rotary electric machine is described with reference to FIGS. 1 to 22. The rotary electric machine, in a non-limiting example, is a starter alternator for use in a vehicle of the mild hybrid type. The rotary electric machine in this type of application is used not only for electric generation and starting of the heat engine (with "stop & go" or "stop/start" functionality), but also for regenerative braking, traction at low speed of the vehicle, and torque assistance of the heat engine.

Figure 1A:
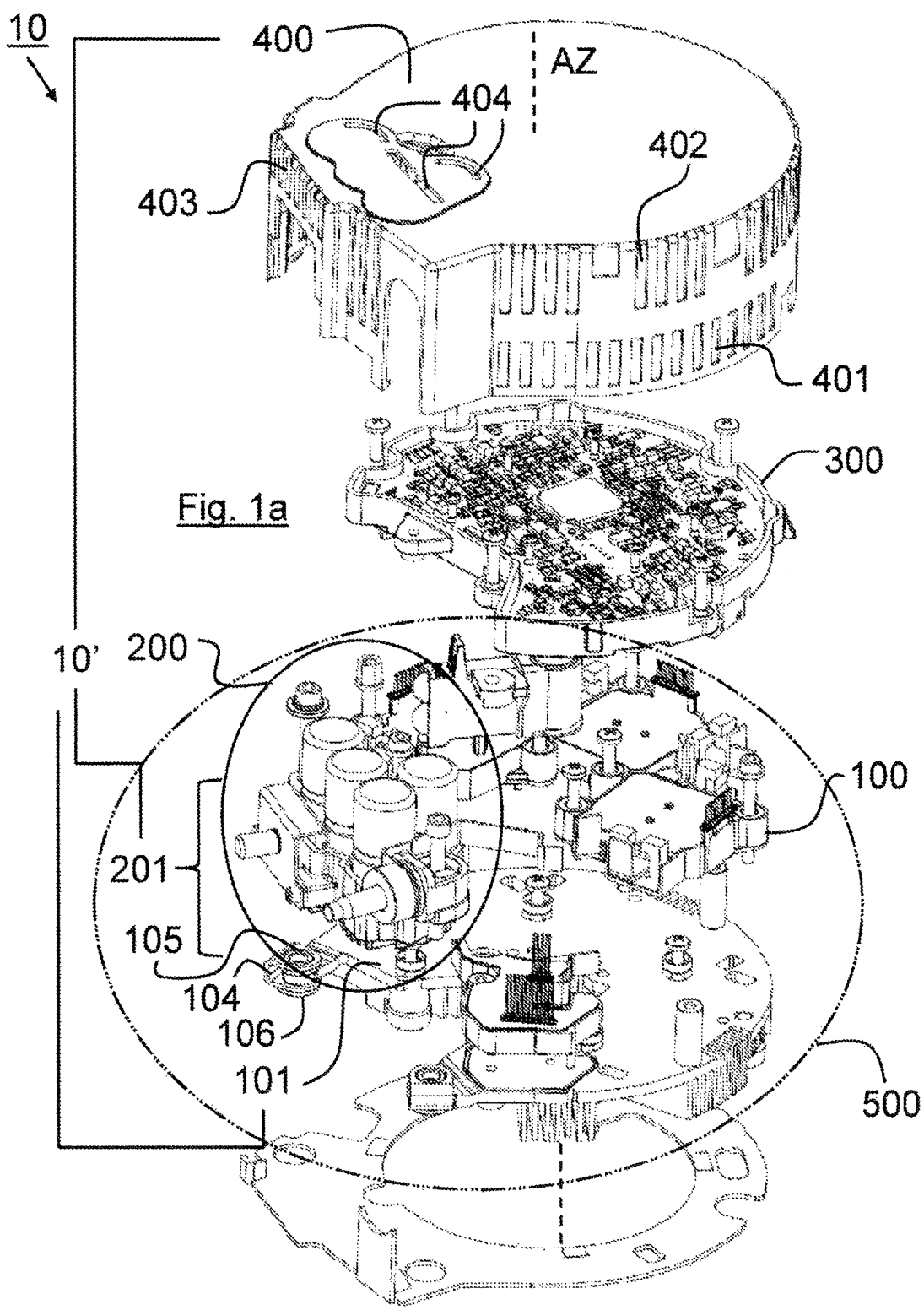
FIG. 1a shows an exploded perspective view of a first non-limiting embodiment of an electronic assembly for a rotary electric machine for a motor vehicle comprising a protective cover according to the invention.
Figure 1B:
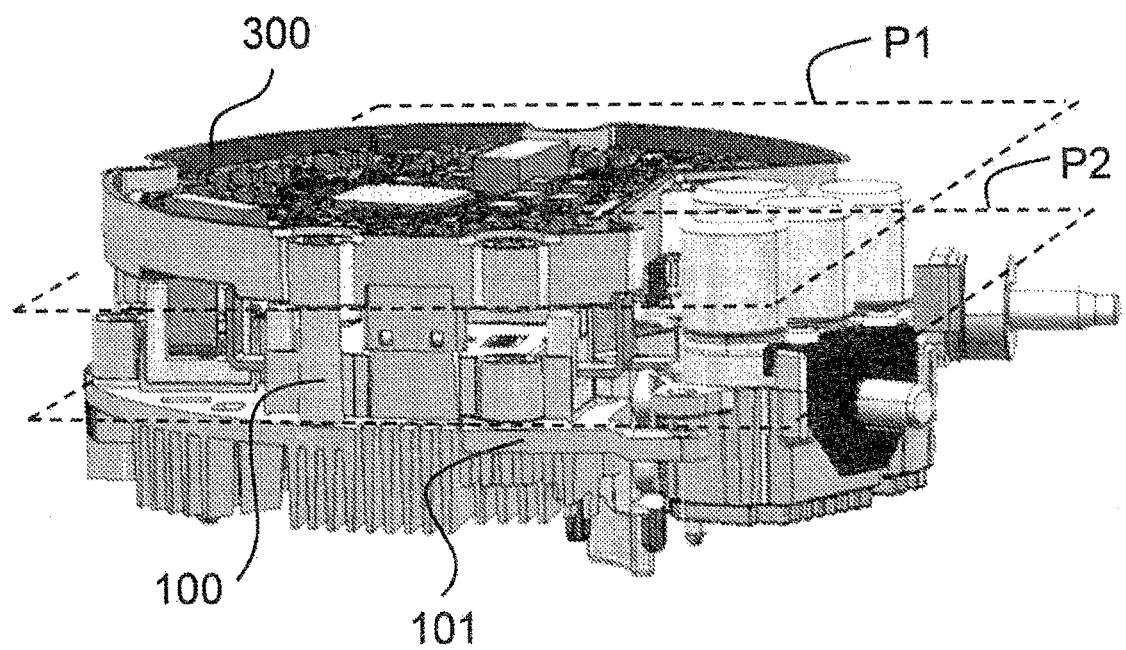

As illustrated in FIG. 1, in accordance with a non-limiting embodiment, the electronic assembly 10 comprises:

electronic component blocks 100, 200, 300, the blocks having different thermal dissipation needs, the blocks being:
 a power block 100;
 a filtering block 200;
 a control block 300;
 a device 10' for cooling said blocks 100, 200, 300, said cooling device 10' comprising:
  a protective cover 400 suitable for covering the power, filtering and control blocks 100, 200, 300, said protective cover comprising openings 401, 402, 403, 404 suitable for generating different flows of cooling air F1, F2, F3, F4 for the thermal dissipation needs of each of the power 100, control 300 and filtering 200 blocks;
  and cooling elements 101, 201, 301 coupled to said protective cover 400.

As will be seen in detail hereinafter, thanks to the structure of the electronic assembly in separate blocks, the creation of the different air flows for cooling the different blocks, and the coupling between the cooling elements to the openings of the cover, a thermal decoupling is obtained between the different blocks and the cooling of each block is optimized. Targeted cooling is obtained for each block, each block having different operating temperatures and thus having different thermal dissipation needs. An improved cooling of the electronic assembly is thus obtained.

In a non-limiting embodiment,
- a first cooling element is a first dissipator 101 provided with a plurality of fins 1011 coupled to said power block 100;
- a second cooling element is a second dissipator 201 provided with a plurality of fins 2011 coupled to capacitors 202 of said filtering block 200;
- the control block 300 is arranged on a first plane P1 parallel to a second plane P2 on which is mounted the power block 100 so as to allow passage of a flow of cooling air F2 between the two blocks 100, 300;
- the openings of the protective cover 400 are divided into:
  - a first set of openings 401 that can be positioned facing the fins of the first dissipator 101;
  - a second set of openings 402 that can be positioned facing the control block 300;
  - the two sets of openings 401, 402 being separated by a separating low wall 405 so as to create a first radial flow of cooling air F1 for said power block 100 and a second radial flow of cooling air F2 for said control block 300; and
  - a third set of openings 403 that can be positioned facing the fins of the second dissipator 201 so as to create a third radial flow of cooling air F3 for said filtering block 200.

The different elements of the power electronic assembly and cooling device 10 thereof, as well as the different air flows generated, will be described in greater detail hereinafter.

Power Block

Figure 2:
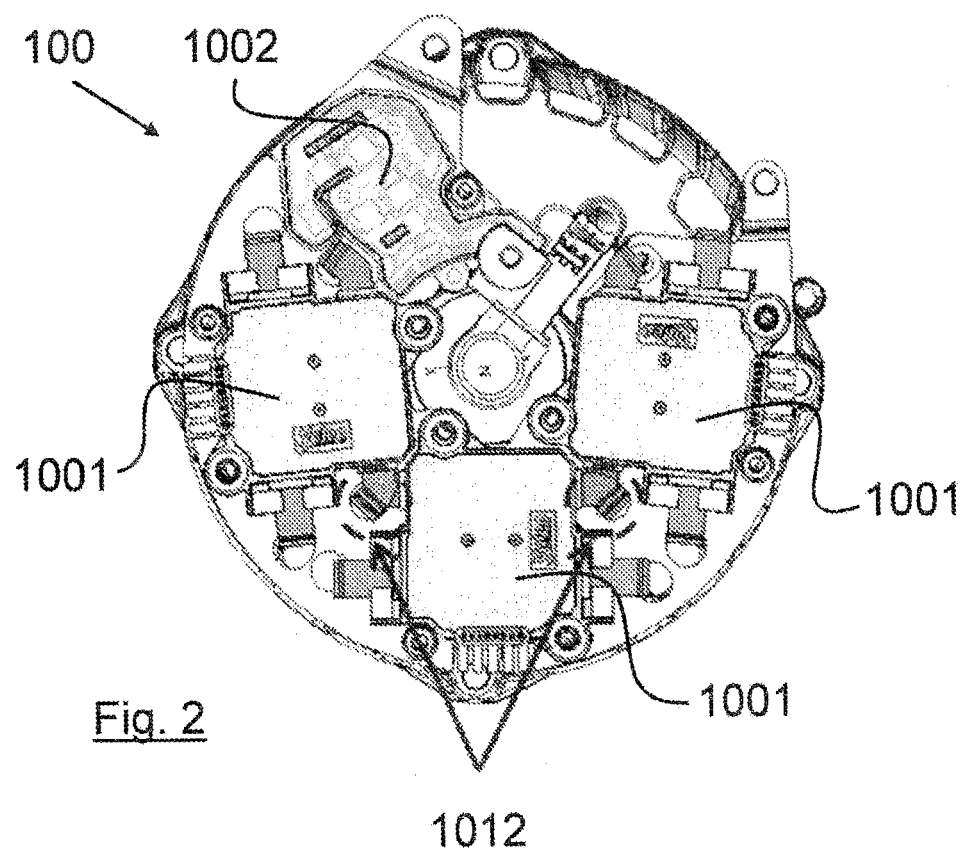
FIG. 2 shows a plan view of a power block of the electronic assembly of FIG. 1.

FIG. 2 represents a plan view of the power block 100. In this non-limiting example, the power block 100 comprises three power modules 1001 and an excitation module 1002.

Figures 3A, 3B:
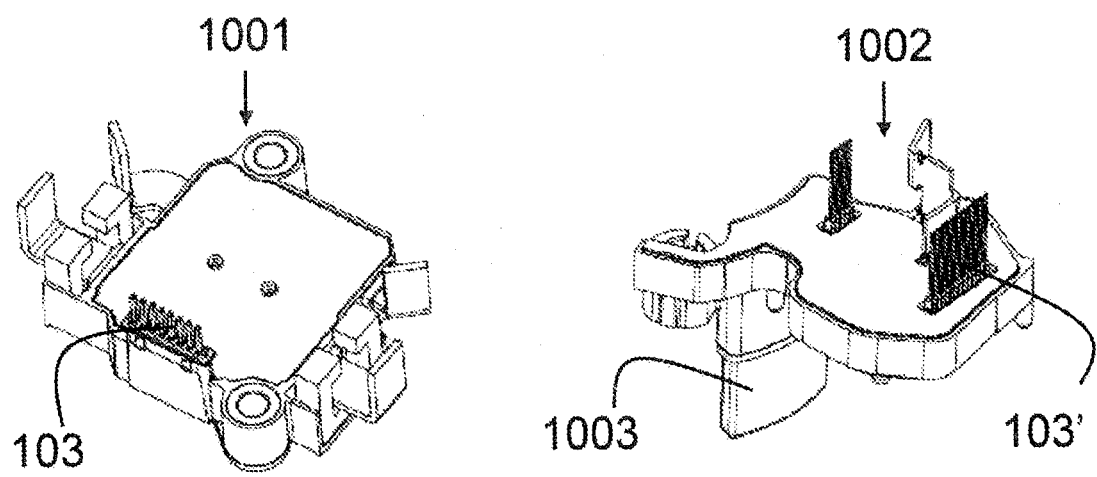
FIG. 3a shows a perspective view of a power module of the power block of FIG. 2.
FIG. 3b shows a perspective view of an excitation module of the power block of FIG. 2.

The power modules 1001 comprise electronic switches, such as MOSFET transistors by way of a non-limiting example, the switches of a module being intended to provide a bridge rectifier/converter branch for a phase of the rotary electric machine. A non-limiting example of a power module 1001 is shown in FIG. 3a. It comprises interconnection pins 103 described later in the description.

The excitation module 1002 makes it possible to supply the coil of the rotor of said machine, said module conventionally comprising MOSFET transistors and diodes making it possible to determine the current in the rotor.

A non-limiting example of an excitation module 1002 is shown in FIG. 3b. It comprises interconnection pins 103' described later in the description. A magnetic sensor 1003 can also be seen which makes it possible to determine the position of the rotor.

Since the power modules 1001 and the excitation module 1002 are sources of heat, it is necessary to cool them.

To this end, the cooling device 10' comprises a first cooling element, which is a first dissipator 101 (also referred to as a power block dissipator) provided with a plurality of fins 1011 coupled to the power block 100. The dissipator 101 further comprises a plurality of orifices 1012 to facilitate airflow. The latter are in a non-limiting embodiment arranged substantially radially under the power block 100. They are conventionally made of aluminum.

Figure 4:
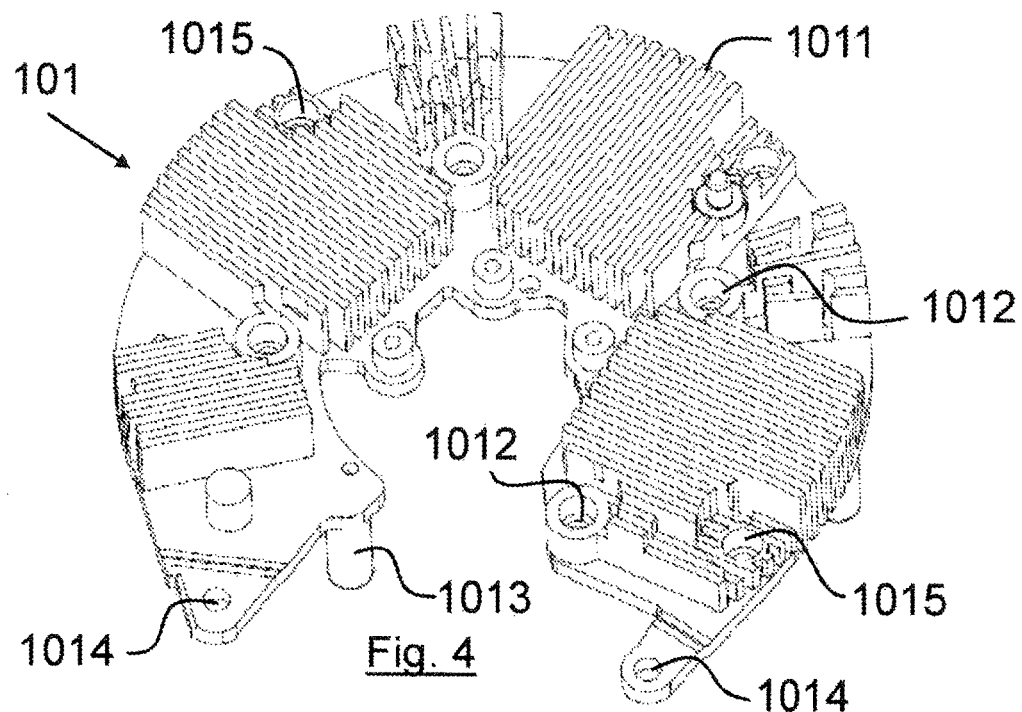
FIG. 4 shows a perspective view of a first dissipator coupled to the power block of FIG. 2.
Figure 6:
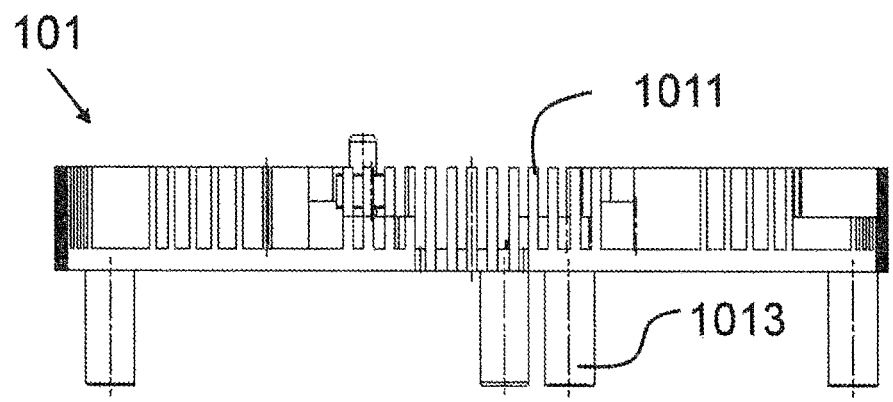
FIG. 6 shows a profile view of the first dissipator of FIGS. 4 and 5.
Figure 7:
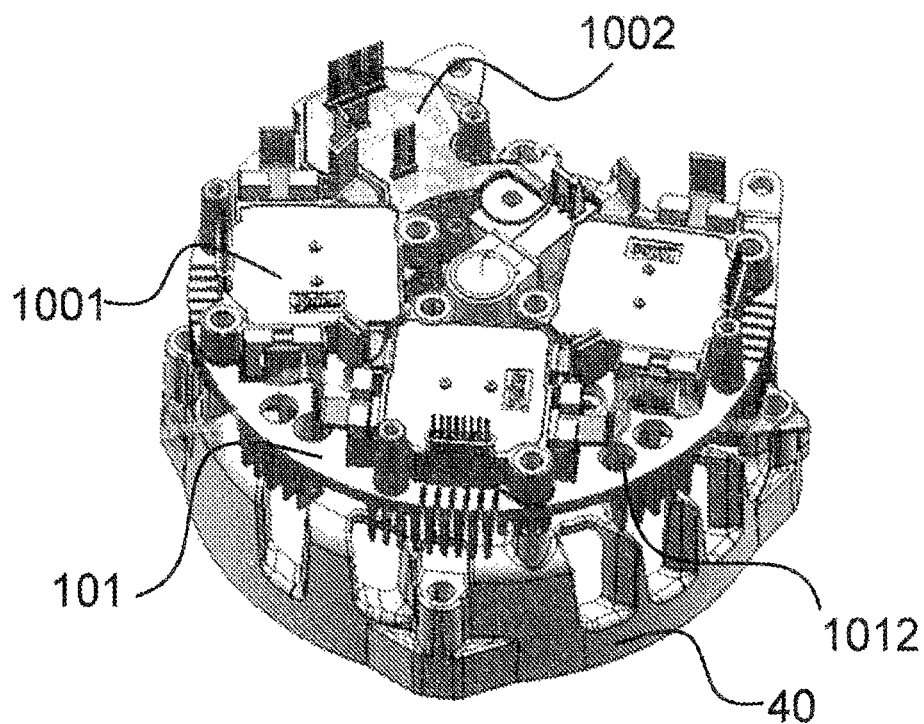
FIG. 7 shows an assembled perspective view of the power block of FIG. 2 with the first dissipator of FIGS. 4 to 6.

The fins 1011 of the first dissipator 101 are represented in the perspective view of FIG. 4 and the profile view of the power block dissipator 101 in FIG. 6.

These fins provide a large surface area for exchange with the air passing through the electronic assembly. Thus, as will be seen hereinafter, the cooling of the block 100 will be optimized thanks to the fins of the dissipator 101.

In addition to the power 1001 and excitation 1002 modules, the power block 100 comprises conductive tracks, which allow the passage of current into the components. These conductive tracks are also sources of heat and must be cooled.

Figure 5:
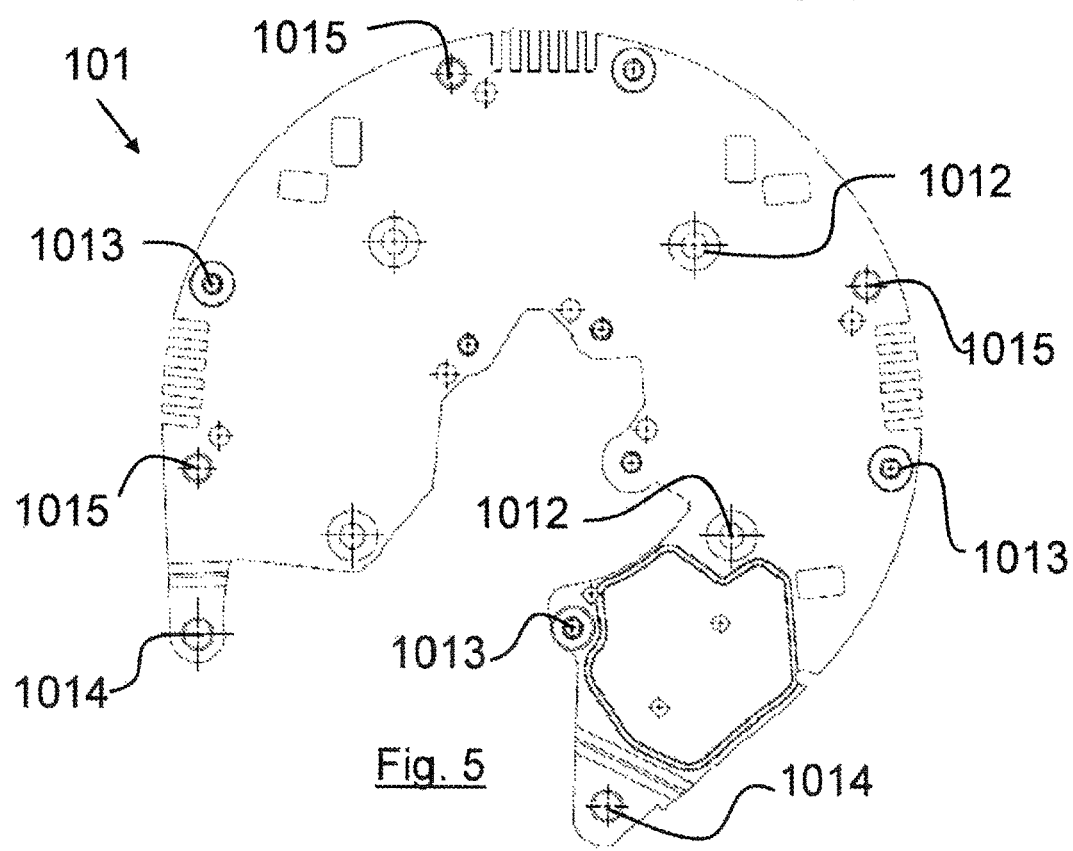
FIG. 5 shows a view from below of the first dissipator of FIG. 4.

It should be noted that the first dissipator 101 also comprises:
- a plurality of mounting tabs 1013 as represented in FIGS. 4 to 6, said tabs making it possible to fix the control block 300. These mounting tabs 1013 serve as spacers between the two blocks 100 and 300. The control block 300 is thus arranged on a plane parallel to that of the power block 100. In a non-limiting example, four tabs are used;
- at least two mounting tabs provided with orifices 1014 as illustrated in FIGS. 4 and 5, these tabs making it possible to fix the filtering block 200. In a non-limiting example, two mounting tabs are used. The filtering block is described hereinafter;
- a plurality of mounting orifices 1015 as represented in FIGS. 4 to 6, said orifices making it possible to fix the power block 100. In a non-limiting example four orifices are used.

Filtering Block

The filtering block 200 is illustrated in FIGS. 8 to 13.

Figure 8:
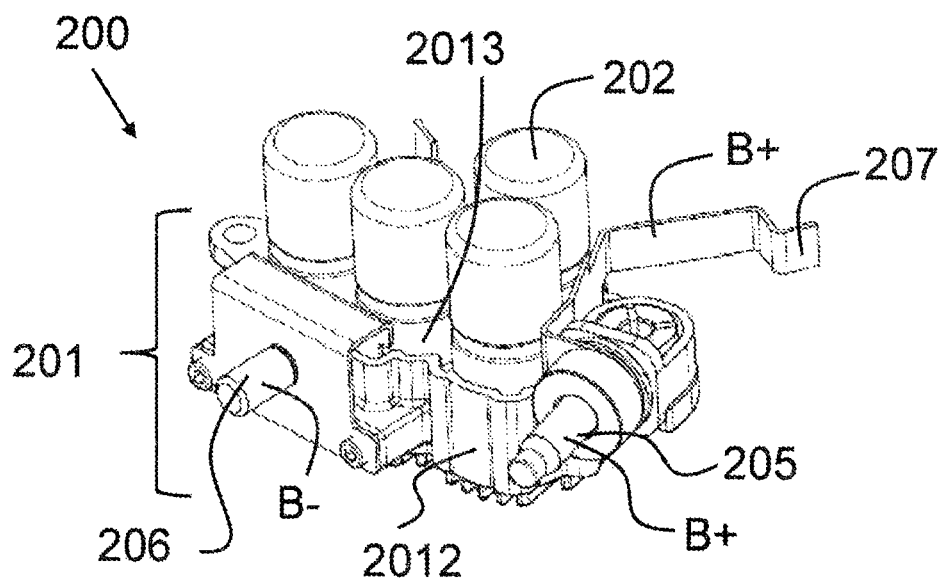
FIG. 8 shows a perspective view of a filtering block of the electronic assembly of FIG. 1.
Figure 9:
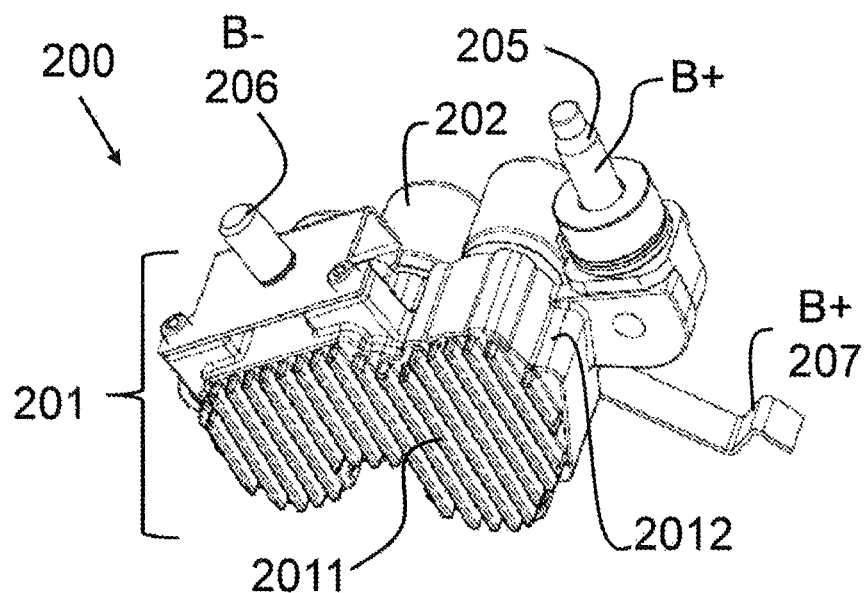
FIG. 9 shows a view of a second dissipator coupled to the filtering block of FIG. 8.
Figure 10:
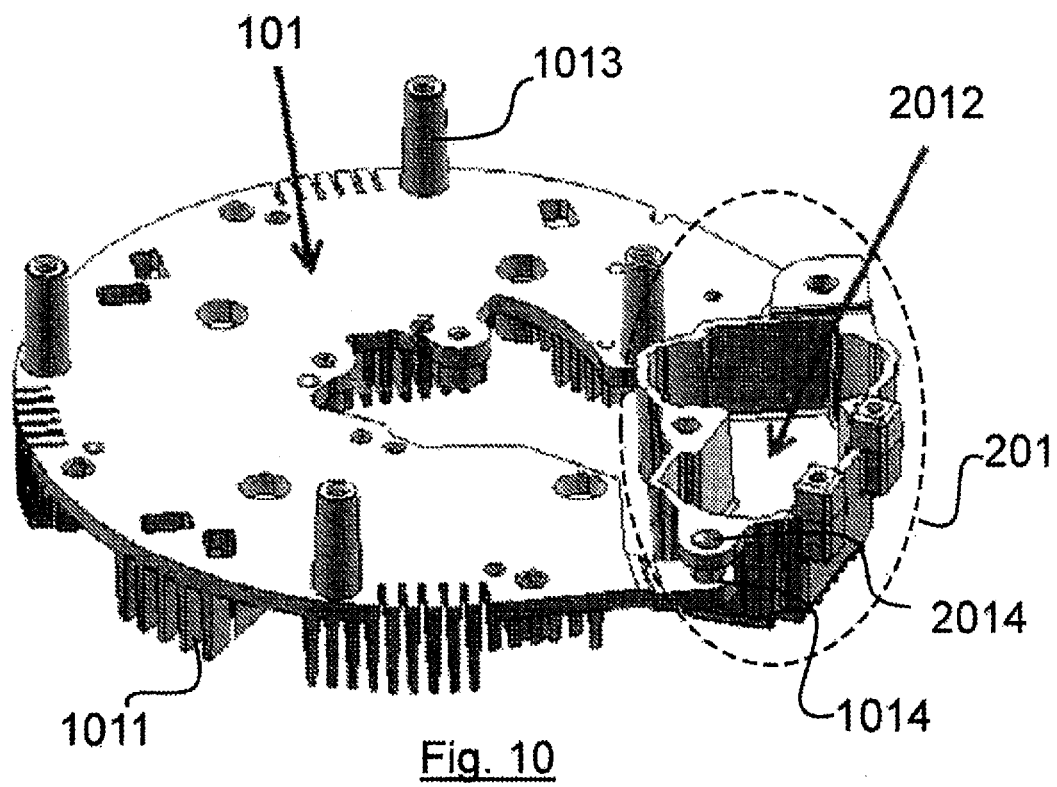
FIG. 10 shows a non-limiting embodiment of assembly of the filtering block of FIGS. 8 and 9 with the first dissipator of FIGS. 4 to 6 without the capacitors.

As illustrated in FIGS. 8 and 9, the filtering block 200 comprises a plurality of capacitors 202 intended to filter the interference originating from the power components (power modules 1001 in particular).

In order to cool the capacitors 202, the cooling device 10' comprises a second cooling element, which is a second dissipator 201 (also referred to as a filtering block dissipator) provided with a plurality of fins 2011, said dissipator being coupled to the capacitors 202.

These fins provide a large surface area for exchange with the air passing through the electronic assembly. Thus, as will be seen hereinafter, the cooling of the block 200 and therefore of the capacitors 202 will be optimized thanks to the fins of the dissipator 201.

In a non-limiting embodiment, the second dissipator 201 is coupled to the capacitors 202 of the filtering block 200 by means of a resin 2013. Thus, the resin makes it possible not only to hold said capacitors 202 in the dissipator, but also to have good evacuation of the calories of the capacitors towards said dissipator 201 via a housing 2012.

In this embodiment in which the machine 1 (FIG. 22) is a machine of the starter alternator type operating under a continuous voltage of 48 volts, voltage potentials B+ and B− are present in the machine 1 and correspond respectively to +48 V and to 0 V of the 48 volts. It should be noted here that B− (0 V) and the general ground potential of the vehicle (referenced M− in FIG. 22) are electrically insulated in the machine 1, this being a general ground that is conventionally connected to the negative electrical terminal of the battery or batteries of the vehicle and also to the body of the latter and that is also connected in the machine 1 to the rear bearing 40 thereof, on which the electronic assembly 10 is fixed. Electrical insulation is thus provided between the electronic assembly, of which the electric ground is at B−, and the rear bearing 40 connected to M−. Of course, an electrical connection can be established between B− and M− in the electric circuit of the vehicle, but in this embodiment this is not provided in the machine 1.

With reference in particular to FIGS. 8 and 9, B+ is connected to the electric circuit of the vehicle via an insulated electrical terminal 205 of B−. B− is connected to the electric circuit of the vehicle via an electrical terminal 206 electrically connected to the metal parts (in particular dissipators) of the power block 100 and of the filtering block 200 and the ground of the control block 300. An electrical connection tongue 207 is also shown in FIGS. 8 and 9, and this tongue 207 ensures the interconnection of B+ between the filtering block 200 and the power block 100.

The power block 100 and the filtering block 200 thus both comprise conductive tracks of positive and negative polarities connected respectively to the potentials B+ and B−. These conductive tracks allow the passage of current through the electronic components of the different blocks 100, 200.

At the power block 100, the first dissipator 101 is connected to the ground B−.

As will be seen hereinafter, thanks to the combination 500 (or group or sub-assembly) shown in FIG. 1a between two blocks of electronic components having different thermal dissipation needs, said blocks being the power block 100 and the filtering block 200, and with the aid in particular of thermal and electrical insulation means and a single conductive element, an electrical connection of B− between the power block 100 and the filtering block 200 is obtained alongside electrical insulation of this B− with respect to the M− of the rear bearing 40, as well as a strong thermal resistance, which makes it possible to obtain a good thermal decoupling between the power block 100 and the filtering block 200.

Figure 11:
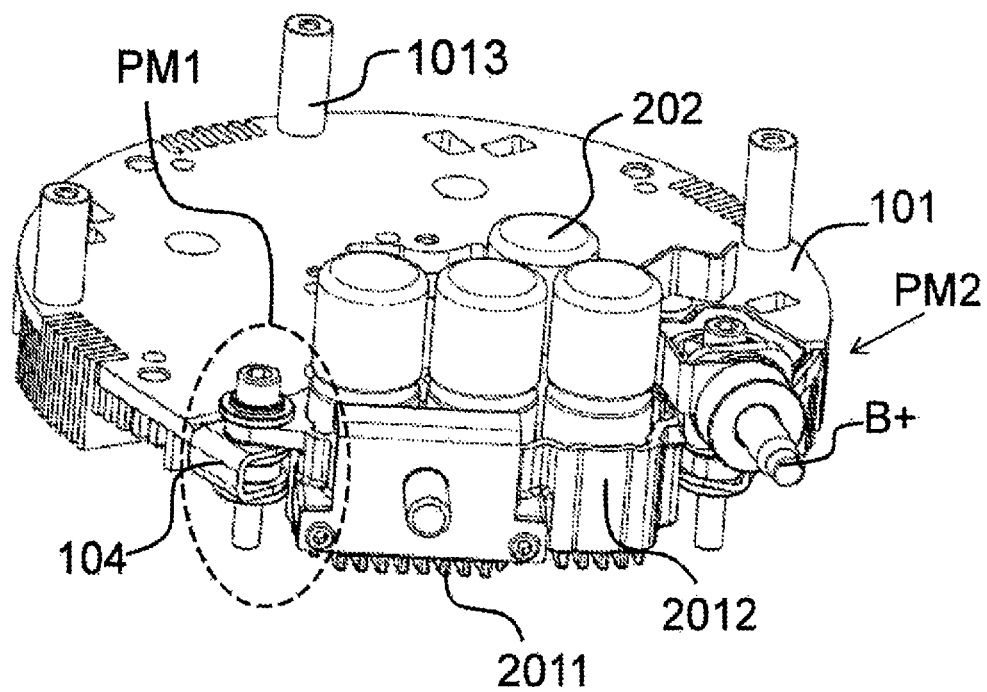
FIG. 11 shows the embodiment of assembly of FIG. 10 with the capacitors.
Figure 12:
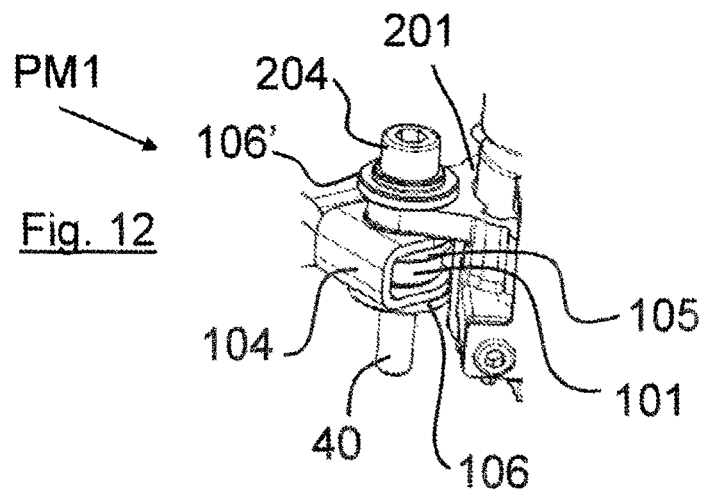
FIG. 12 shows an enlarged view of a part of the assembly of FIG. 11.
Figure 13:
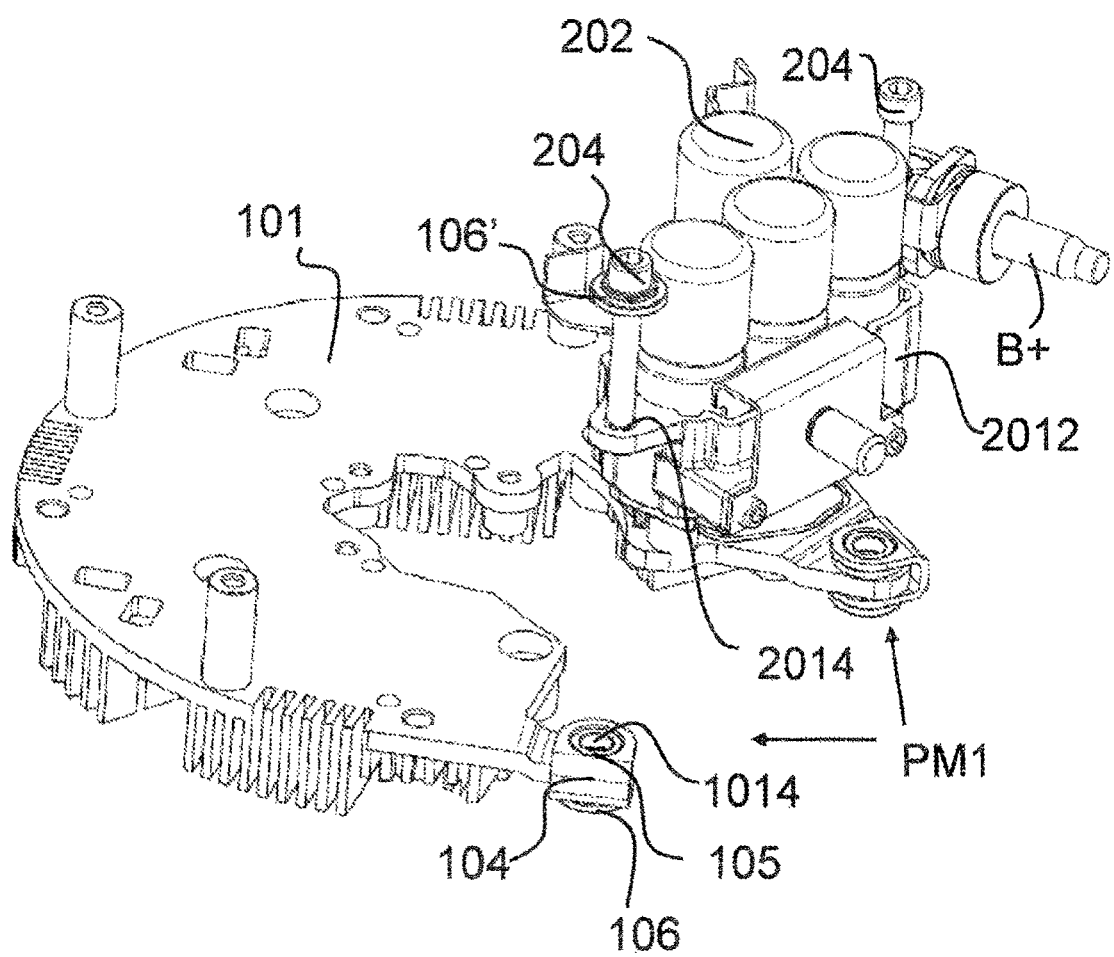
FIG. 13 shows an exploded view of the assembly of the filtering block of FIG. 11.

The combination 500 (or group or sub-assembly) is illustrated in FIG. 1a, and the electrical, thermal and mechanical connections of such a combination 500 are illustrated in FIGS. 11 to 13. In the latter figures, the power block 100 has not been shown in order to provide greater clarity.

Thus, in a non-limiting embodiment, the electrical, thermal and mechanical assembly of the combination 500, between the blocks 100 and 200, and the mounting thereof on the rear bearing 40 of the machine is ensured at two mounting points PM1 and PM2 (FIG. 11). At a first mounting point PM1 shown in FIGS. 12 and 13 in particular, this assembly is provided by means of:
  a mounting screw 204;
  an electrically conductive element 104 at potential B−, a first end 1040 of which is in direct contact, via an upper face, with a mounting tab of the filtering block 200, on a lower face of said tab of the block 200, and a second end 1041 of which is in direct contact, via an upper face, with a mounting tab of the power block 100, on a lower face of said tab of the block 100, said tabs of block 200 and of block 100 being formed by extensions of the dissipators 201 and 101 respectively;
  a thermal insulator 105 arranged between:
    said tab of the block 100, which is an extension of the first cooling element 101, which is the first dissipator 101 provided with a plurality of fins 1011 and coupled to said power block 100; and
    a lower face of said conductive element 104;
  a first electrical insulator 106 arranged between said conductive element 104 and the rear bearing 40 of the rotary electric machine; and
  a second electrical insulator 106' arranged between a head of the mounting screw 204 and an upper face of said tab of the filtering block 200.

The functions of the conductive element 104, of the thermal insulator 105 and of the electrical insulators 106 and 106' will be explained below.

In order to connect the power block 100 and the filtering block 200 at the same potential B−, in a first non-limiting embodiment, the conductive element 104 is used as illustrated in FIGS. 11 to 13. In a non-limiting embodiment said conductive element is a busbar of U-shape in general.

It is pointed out that a busbar is a shaped plate of copper or aluminum. In a non-limiting embodiment it may comprise an additional tinning so as to prevent oxidation of the copper.

This busbar 104 is arranged between the dissipator of the power block 101 and the dissipator of the filtering block 201, as illustrated in FIG. 12, so as to create a junction between the two blocks 101 and 201. The busbar thus acts as an electrical conductor and has a negative polarity B− by the direct contact thereof with the tabs of the blocks 100 and 200.

As illustrated in FIGS. 10 to 13, the first dissipator 101 and the second dissipator 201 comprise respectively mounting tabs provided with mounting orifices 1014, 2014 suitable for cooperation with one another.

As illustrated in FIG. 13 which shows an exploded view of FIG. 11, the second dissipator 201 comprises mounting orifices 2014 that are disposed opposite the above-described mounting orifices 1014 of the first dissipator 101, and the mounting screws 204 are inserted into these mounting orifices 1014, 2014 and are screwed onto the rear bearing 40, thus ensuring a mechanical fixing of the electronic assembly 10 onto the rear bearing 40 of the machine.

This embodiment utilizing the busbar 104 and the thermal insulator 105 makes it possible to minimize the thermal exchanges compared with another embodiment in which the two dissipators 101 and 201 would be placed in direct contact by the metal conductive parts thereof. In fact, in the described embodiment, the metal conductive part of the busbar is dimensioned in section and contact surface so as to minimize the thermal exchanges between the power block 100 and the filtering block 200, while at the same time allowing an electrical conduction needed between blocks 100 and 200. The thermal conduction between the dissipators 101 and 201 is thus minimized knowing that the thermal and electrical conduction between the dissipators 101 and 201 can be provided only through the busbar 104 due to the presence of the thermal (and electrical) insulator 105. The thermal resistance between the dissipators 101 and 201 is thus increased, which reduces the thermal exchanges and allows a good thermal decoupling between the power block 100 and the filtering block 200, the two blocks 100 and 200 operating in different temperature ranges.

It should be noted that, due to the presence of capacitors 202, the filtering block 200 must not reach excessively high temperatures (above 150° C. by way of a non-limiting example), otherwise the capacitors 202 could be subjected to deterioration. Now, the power block 100 for its part can exceed 150° C. due to the presence of MOSFET switches, which release a lot of heat. It is thus necessary to carry out a thermal decoupling between the filtering block 200 and the power block 100 whilst allowing the passage of current between the two blocks.

The electrical insulators 106 and 106' allow the electrical insulation between the dissipators 101 and 201 at B– and the rear bearing 40 at M– of the rotary electric machine 10, knowing that the mounting screw 204 screws into the metal part of the rear bearing 40 of the machine. The electrical insulators 106 and 106' prevent any contact between the mounting screw 204 and the dissipators 101, 201 and busbar 104.

In a non-limiting example, the insulator 105 is a washer made of a plastic of low thermal conductivity, and the insulators 106 and 106' are washers made of a plastic of low electrical conductivity. These washers are illustrated in FIG. 12 which is an enlarged view of the dotted line part of FIG. 11.

It should be noted that the orifices 1014, 2014 of the mounting tabs must have a diameter that is sufficiently large compared to that of the mounting screw 204 to avoid any contact thereof with the inner walls of the orifices 1014, 2014 and to allow the insertion of a surrounding collar (not shown) of the insulating washers 106, 106' into the space between the circular edges/inner walls of the orifices 1014, 2014 and the surface of the shank of the mounting screw 204, this surrounding collar guaranteeing the impossibility of such contact. These means make it possible to obtain the desired mounting with electrical insulation between the metal parts of the dissipators 101/201 and the rear bearing of the machine.

A second mounting point PM2, at the insulated electrical terminal 205 is used for the electrical, thermal and mechanical assembly of the combination 500 between the blocks 100 and 200 and for the mounting thereof on the rear bearing 40 of the machine. Since the means used are substantially the same as those used at the first mounting point PM1, these will not be detailed here.

Control Block

Figure 14:
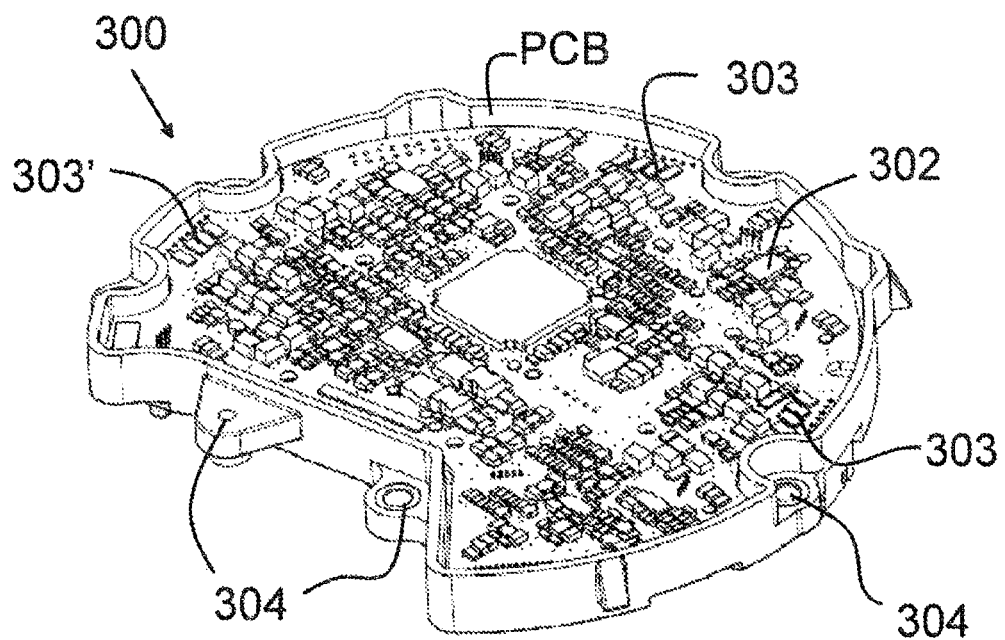
FIG. 14 shows a perspective view of a control block of the electronic assembly of FIG. 1.
Figure 15:
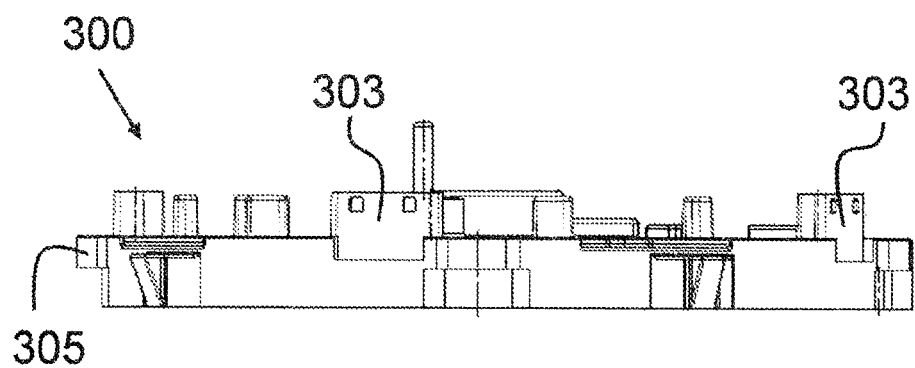
FIG. 15 shows a profile view of the control block of FIG. 14.
Figure 16:
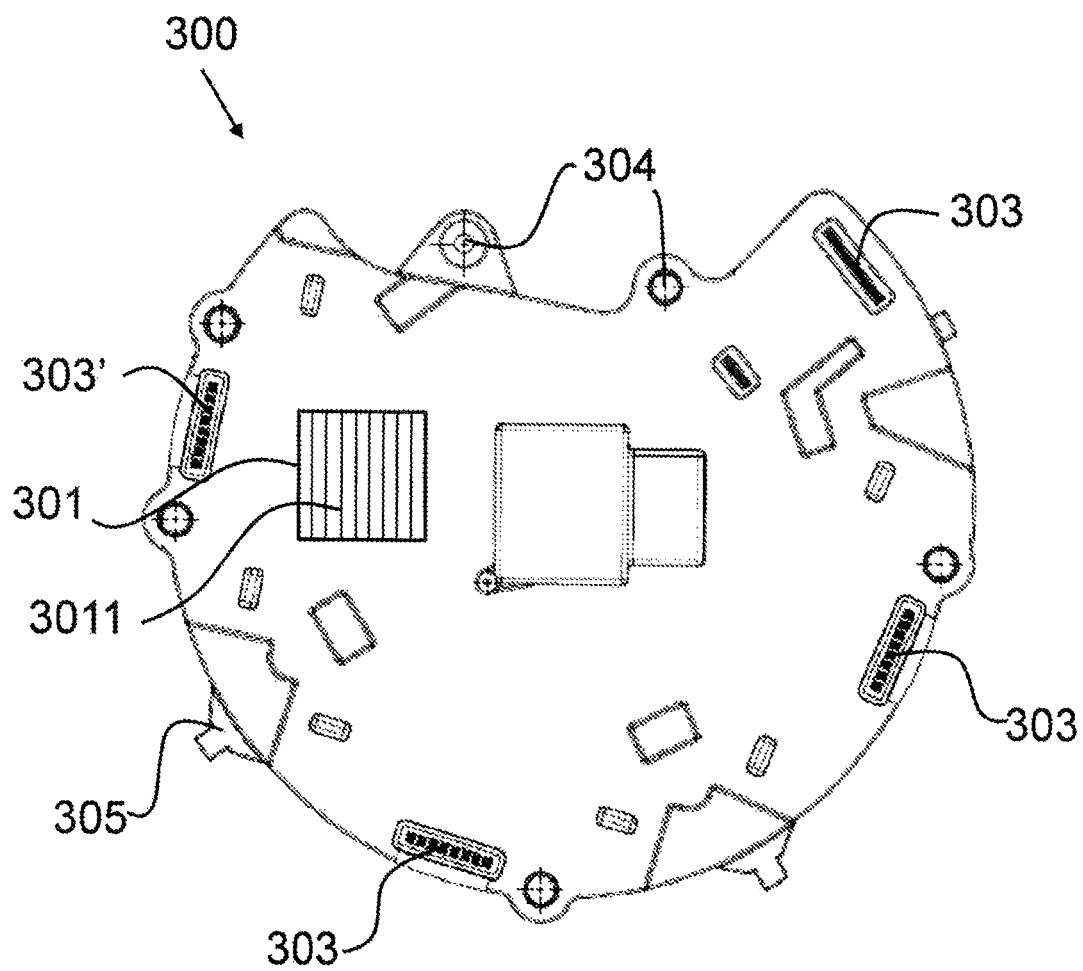
FIG. 16 shows a view from below of the control block of FIGS. 14 and 15.

The control block is illustrated in FIGS. 14 to 16. As illustrated in the perspective view of FIG. 14, the control block 300 comprises components 302 for controlling the rotary electric machine and in particular the setting of the machine by controlling the power modules 1001 of the power block 100. Since the components 302 are known to a person skilled in the art, they are not described in the rest of the description.

The control block is composed of a printed circuit board (PCB) on which the control components 302 are mounted.

The control block 300 is thermally separated from the power block 100.

Thus, the control function of the power modules is not located in the latter. To this end, in a non-limiting embodiment, the control block 300 is arranged on a first plane P1 parallel to a second plane P2 on which the power block 100 is mounted so as to allow a passage of a flow of cooling air F2 between the two blocks 100, 300. Thus, by creating a space between the two blocks 100 and 300, this makes it possible to guide the air between the two blocks. The whole is thus cooled whilst creating a thermal decoupling between the two blocks. The creation of this flow of air will be explained in the description below.

In a non-limiting example the control block 300 is mounted above the power block 100 by means of mounting orifices 304 coupled to the mounting tabs 1013 of the first dissipator 101, which serve as spacers as seen before.

In order to communicate therebetween, the power block 100 and the control block 300 are connected to one another by means of interconnection pins, respectively 103, 103', as illustrated in FIGS. 2, 3, 4. These interconnection pins 103-103' are inserted respectively into spaces provided 303-303' in the control block, as illustrated in FIG. 14. FIG. 15 is a profile view of the control block 300.

FIG. 16 shows the control block 300 in a view from below. The spaces 303-303' for inserting the interconnection pins 103-103' described previously are shown, as are the mounting orifices 304 described previously.

Since each pin has a small section, the possibility of heat exchange between the two blocks is minimized. It should be noted that the power modules 1001 comprise a first set of interconnection pins 103, which are signal pins.

In addition, the excitation model 1002 comprises interconnection pins 103' that make it possible to send measurement signals and control signals. Thus, said interconnection pins make it possible to control the excitation current of the rotor and to check said current, to send sensor signals in order to check the position of the rotor, to raise the temperature of the machine, etc.

It will also be noted that, during operation thereof, some components of the PCB will heat up and cause the temperature of the PCB plate to rise. Also, in order to cool this PCB plate, the cooling device 10' in a non-limiting embodiment comprises a third cooling element, which is a third dissipator 301 (also referred to as the control block dissipator) provided with a plurality of fins 3011 coupled to the control block 300 as illustrated in the view from below of FIG. 16.

Thus, by inserting a dissipator into the PCB housing, more precisely on the lower face of the PCB, it is possible to also use the same flow of cooling air F2 that allows the thermal decoupling between the control block 300 and the power block 100 in order to extract the calories introduced by the components of the PCB.

In non-limiting examples the third dissipator 301 is coupled to components of the control block 300 by means of a resin, a metal strip, a gap filler or a gap pad.

Protective Cover

As will be seen hereinafter, the flows of cooling air suitable for each different thermal dissipation block are generated and oriented on the different blocks by means of the protective cover. Some of these flows of air will thus sweep over the fins of the different dissipators coupled to the different blocks and will thus optimize the cooling of said blocks, said fins increasing the surface area of dissipation of components that heat up.

Figure 17:
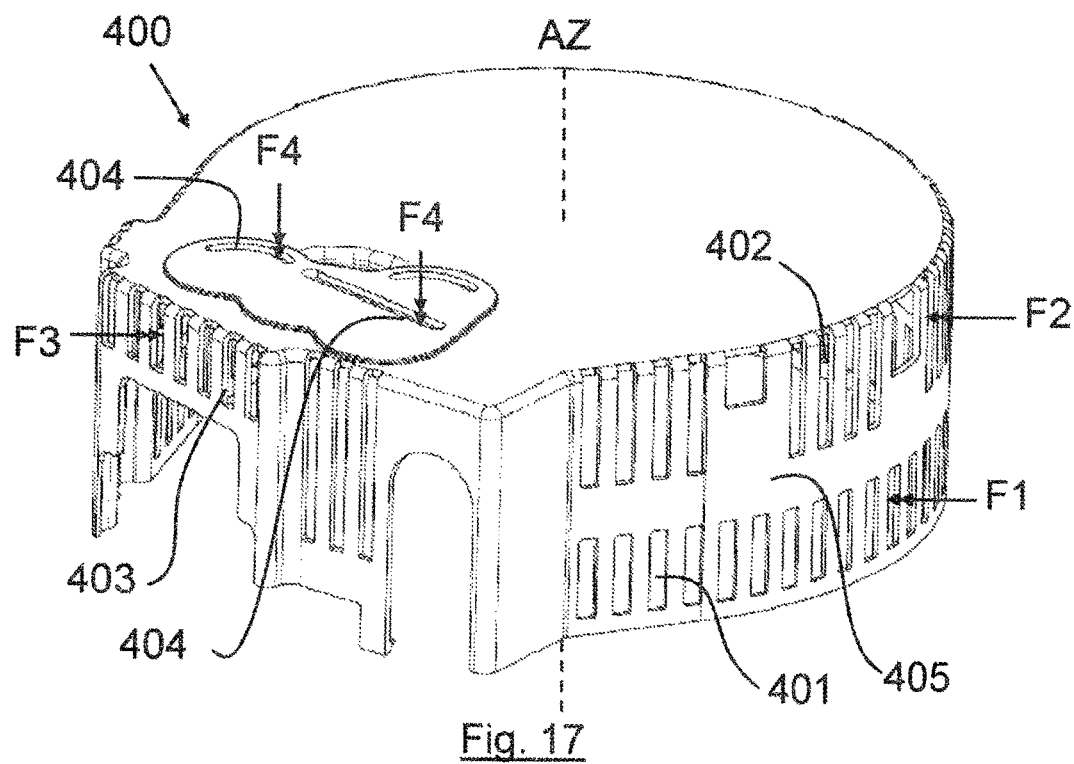
FIG. 17 shows a perspective view of a protective cover of the electronic assembly of FIG. 1, according to the invention.
Figure 18:
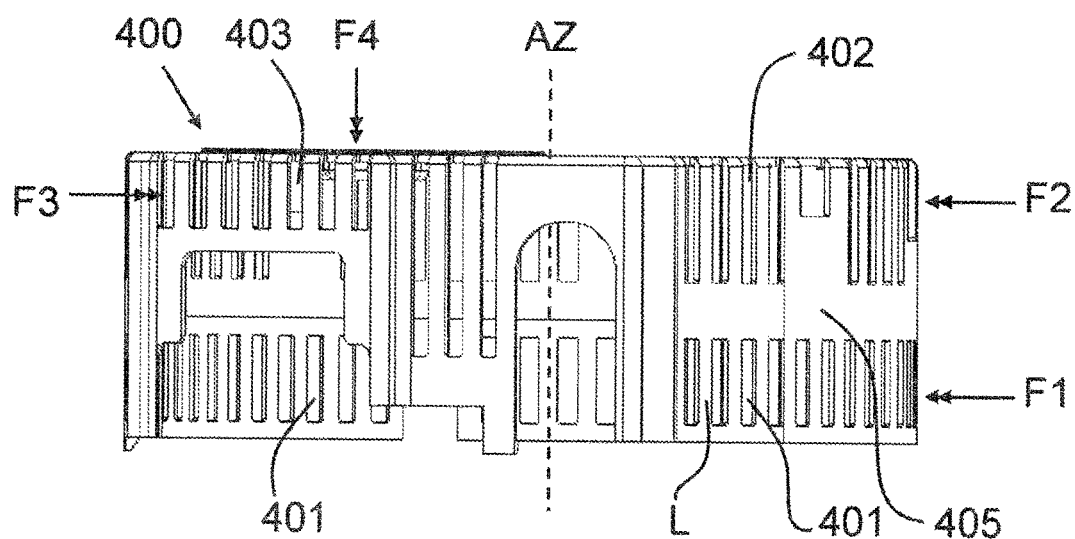
FIG. 18 shows a profile view of the protective cover of FIG. 17.
Figure 19:
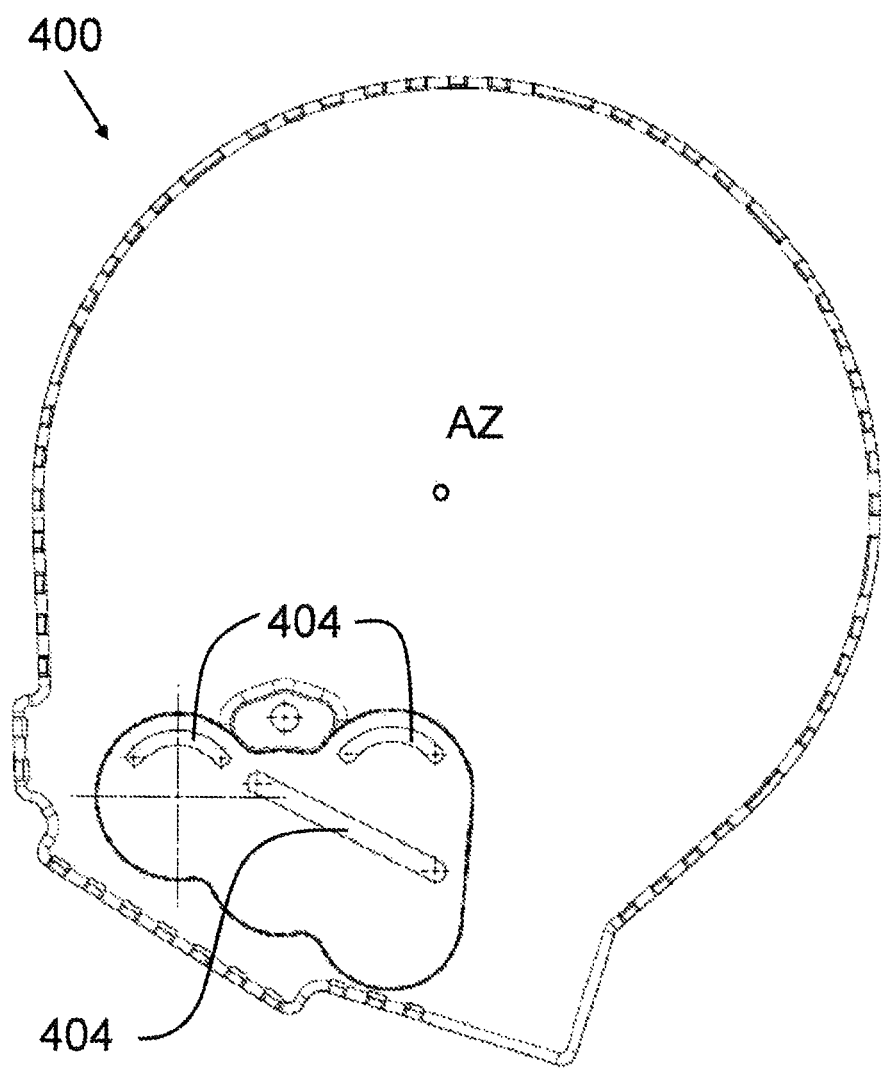
FIG. 19 shows a plan view of the protective cover of FIGS. 17 and 18.

The protective cover 400 is illustrated in FIGS. 17 to 19.

As illustrated in FIGS. 17 and 18, the protective cover 400 comprises openings that are divided into:
- a first set of openings 401 that can be positioned opposite the fins of the first dissipator 101;
- a second set of openings 402 that can be positioned facing the control block 300;
  - the two sets of openings 401, 402 being separated by a separating low wall 405 so as to create a first radial flow of cooling air F1 for said power block 100 and a second radial flow of cooling air F2 for said control block 300; and
- a third set of openings 403 that can be positioned opposite the fins of the second dissipator 201 so as to create a third flow of cooling air F3 for said filtering block 200.

The fan 50 of the electric machine sucks in air in order to cool the stator of said machine. This air is sucked in laterally via the openings 401, 402, 403 of the protective cover and then flows towards and through said openings. From this sucked-in air, due to the presence of the three types of openings 401, 402 and 403 and of the separating low wall 405, three different flows of air are created respectively, F1, F2 and F3.

In this non-limiting embodiment, the separating low wall 405 which serves as separation between the first set of openings 401 and the second set of openings 402 consists of the material of the cover 400.

First Set of Openings 401

The first set of openings 401 makes it possible to generate the first flow of air F1. Since this first flow of air F1 is sucked in by the fan towards the base, it sweeps over the lower surface of the power block 100 (via the first dissipator 101). As can be seen in the explanatory diagram of FIG. 20, the first flow of air F1 will flow radially through the first set of openings 401 and will sweep over the dissipator elements, that is to say the fins 2011 of the first dissipator 101 over their entire length, before exiting axially towards the electric machine 1, that is to say along the axis AZ of the rotor. The power block 100 is thus cooled by the cooling of the first dissipator 101 via the fins.

Second Set of Openings 402

The second set of openings 402 makes it possible to generate the second flow of air F2. As can be seen in the explanatory diagram of FIG. 20, this second flow of air F2 flows through the second set of openings 402 and radially beneath the lower surface of the control block 300, before exiting axially along the axis AZ. The control block 300 is thus cooled.

A good thermal decoupling between the two blocks 100 and 300 is obtained by this separation of the flow of cooling air into a first flow F1 and a second flow F2 having different flow paths.

It should be noted that in the non-limiting embodiment in which the third dissipator 301 is present, the cooling of the components of the control block 300 by the flow of air F2 is optimized because said flow F2 will sweep over the fins 3011 of said dissipator 301. The extraction of the calories introduced by some components of the PCB housing that heat up is thus improved.

In a non-limiting embodiment, the openings of the first set of openings 401 and of the second set of openings 402 of the protective, cover 400 are lateral and are arranged in the same direction as the fins of the first dissipator 101. Thus, since the openings in the protective cover are arranged in the same direction as the fins of the first dissipator 101, that is to say vertically here, the flow of air that passes through the openings and that will sweep over the fins is greater than if the openings were in a different direction.

Thus, by producing two sets of openings 401, 402 over the height of the protective cover 400, instead of a single set, it is possible to better channel the incoming flow of air. Furthermore, the positioning of the low wall 405 between the two sets of vertical openings 401, 402 makes it possible to obtain two flows of air for respectively cooling the power block 100 and the filtering block 200.

In order to optimize the coupling between openings in the cover/fins of the first dissipator 101, it is necessary for these openings to be correctly positioned with respect to the fins of the first dissipator 101.

Figure 20:
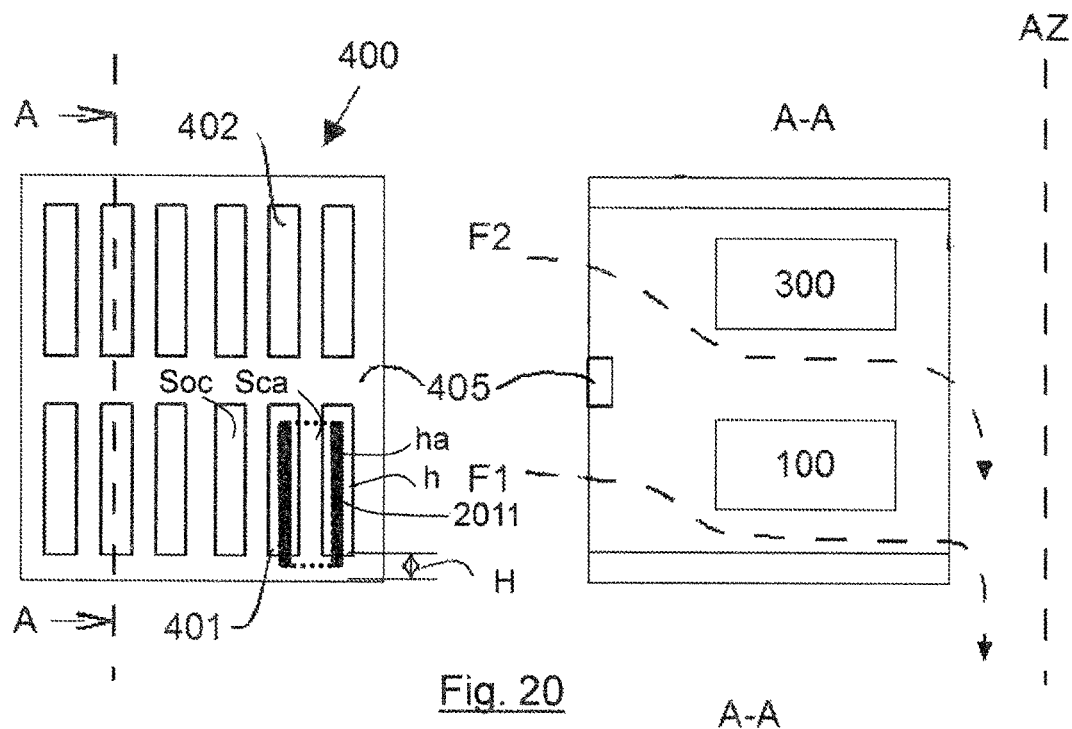
FIG. 20 is a diagram explaining the air flows generated by lateral openings of the protective cover of FIGS. 17 to 19.
Figure 21:
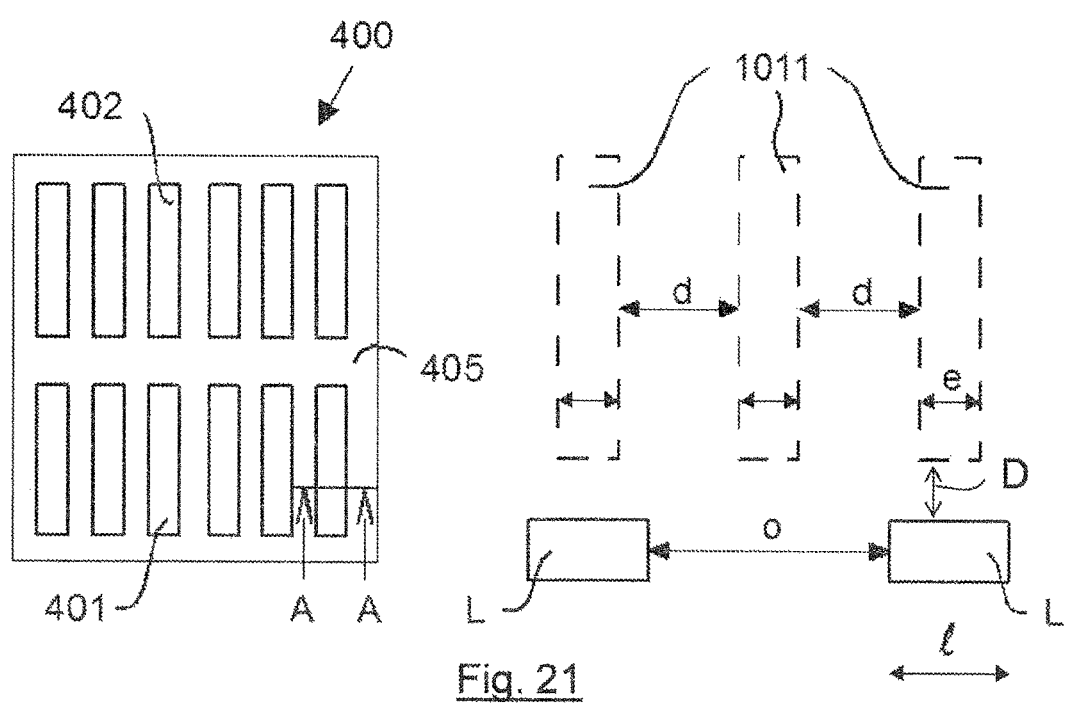
FIG. 21 is a diagram explaining the openings of the protective cover of FIGS. 17 to 19 which are arranged facing the fins of the first dissipator of FIGS. 4 to 6 and of the second dissipator of FIG. 9.

With reference more particularly to FIGS. 20 and 21, the fins of the first dissipator 101, the protective cover 400 and the openings of the first set of openings and/or of the second set of openings 401, 402 are arranged so as to satisfy the following relationships:

$$h \geq 0.5 \cdot ha \quad (1)$$

$$H < 0.5 \cdot ha, \text{ and} \quad (2)$$

$$D \geq 0.5 \cdot (d^2 - ((o-e)/2)^2)^{1/2} \quad (3)$$

where h is the height of the cover opening, ha is the height of the fin, H is the distance between the base of the cover and the base of the opening, D is the distance between the inner edge of the cover and the leading edge of the fin, d is an inter-fin space separating two adjacent fins, o is the width of a, cover opening and e is the thickness of a fin.

The relationships (1) to (3) above have been determined by the inventive entity by means of tests aiming to determine an arrangement that offers an optimum of cooling. The relationship (1) in particular makes it possible to guarantee that the cover opening section Soc is sufficiently greater than the section of the inter-fin channel Sca.

Third Set of Openings 403

The third set of openings 403 makes it possible to generate the third flow of air F3. This flow of air will flow radially through the third set of openings 403 and will sweep over the dissipator elements, that is to say the fins of the second dissipator 201 over their entire length, before exiting axially towards the electric machine, that is to say along the axis AZ of the rotor.

In a non-limiting embodiment the openings of the third set of openings 403 are lateral and are arranged in the same direction as the fins of the second dissipator 201.

Thus, since these openings in the protective cover are arranged in the same direction as the fins of the second dissipator 201, that is to say vertically here, the flow of air that passes through the openings and that will sweep over the fins is more significant than if the openings were in a different direction.

This therefore makes it possible to obtain a large surface area of exchange with the third flow of air F3 and therefore to cool the filtering block 200, and in particular the capacitors 202, all the more.

Fourth Set of Openings 404

In a non-limiting embodiment the protective cover 400 also comprises a fourth set of openings 404 that are arranged on the top of said cover 400 (as illustrated in FIGS. 17 or 19) and that can be positioned above capacitors 202 of the filtering block 200 so as to create a fourth flow of cooling air F4 for the filtering block 200.

As illustrated in FIGS. 17 and 18, this fourth flow F4 will flow axially through the fourth set of openings 404, that is to say parallel to the axis AZ of the rotor, and will sweep over the capacitors 202, but also the dissipator elements, that is to say the fins 2011 of the second dissipator 201, before exiting towards the electric machine.

An axial flow of air also cooling the filtering capacitors 202 is thus created.

Thus, the fins of the second dissipator 202 receive a radial flow of air 23 and an axial flow of air F4, which makes it possible to increase the surface area of exchange with the air and therefore obtain an optimal flow of air (composed of two flows of air) over the fins. Thanks to this optimization of thermal exchange, the capacitors are thus cooled well.

It should be noted that another function of the protective cover 400 is to protect the electronic assembly against mechanical attacks, such as the intrusion of a screw or of a mechanical tool for example, etc. The openings 401, 402, 403 and also 404 must also be dimensioned so as to avoid such mechanical attacks and so as to observe a maximum width l determined in accordance with the desired protection against said attacks. The value l is thus dictated by the degree of protection desired for the starter alternator against the penetration of foreign bodies, which are in particular solid (also referred to as IP protection).

Figure 22:
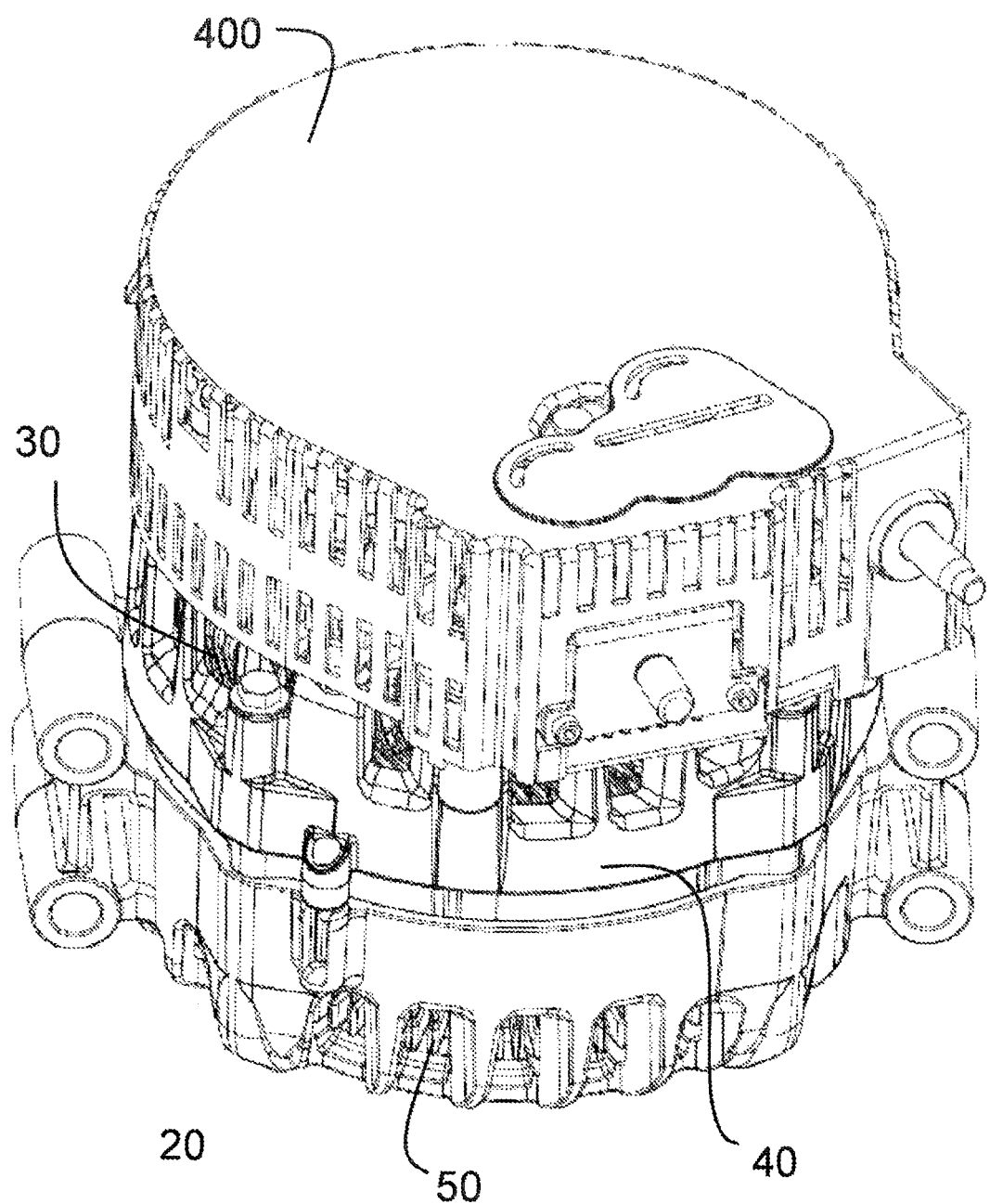
FIG. 22 shows a rotary electric machine comprising the electronic assembly of FIG. 1.

Thus, the electronic assembly 10 described above makes it possible to operate the starter alternator 1. The latter comprises, as illustrated in FIG. 22:

- a rotor (not shown in FIG. 22);
- a stator 30 coupled to said rotor and comprising plurality of phases;
- an electronic assembly 10 in accordance with any one of the preceding features, the power block 100 of said electronic assembly 10 being suitable for being connected to the phases of said stator 30;
- a rear bearing 40 supporting said stator 20; and
- a fan 50 arranged in the proximity of the rear bearing 40.

Of course, the description of the invention is not limited to the application, to the embodiments, or to the examples described above.

Thus, the present invention applies to any type of reversible multi-phase rotary electric machine, such as starter alternators, driven by belt for example or integrated, and in particular for hybrid applications.

Thus, in another non-limiting exemplary application, the starter alternator is full hybrid and makes it possible to drive the motor vehicle by means of the electric motor alone (generally during start-up), or by means of the heat engine alone (generally when the speed rises), or by the engine and the electric motor at the same time (for example in order to obtain stronger acceleration). The battery that supplies the electric motor recovers energy by regenerative braking.

Thus, the invention described in particular has the following advantages:

- it allows a thermal decoupling between the control block and the power block thanks to:
- the mechanical assembly thereof: the two blocks are arranged on two parallel planes with a space allowing the passage of a flow of air, and
- the electrical assembly thereof: the two blocks are connected via the interconnection pins, which minimize the possibility of thermal exchange between the two blocks, the thermal exchange surface area being very low;
- the second flow of air passing between the control block and the power block;
- it allows a thermal decoupling between the power block and the filtering block thanks to:
- the thermal insulation of the second dissipator and the first dissipator via the insulating washers;
- the electrical assembly thereof: the two blocks are connected via a single busbar, which minimizes the possibility of thermal exchange between the two blocks, the conductive part being reduced.
- it allows an optimization of the cooling of the components of the electrical assembly thanks to:
- the structure in separate operational blocks (power block, filtering block, control block), the blocks having different operating temperatures (medium and maximum) as well as different dissipation needs;
- the creation of flows of air dedicated to each functional block via the structure of the protective cover of the cooling device:
  - the presence of the separating low wall between two sets of openings;
  - the openings for orienting the entry of air into the electronic assembly;
  - the shape and positioning of these openings with respect to the cooling fins of the first and second dissipators;
- the coupling of the cooling elements of the cooling device, that is to say different dissipators, with the different functional blocks, the fins of said dissipators making it possible to increase the surface area for exchange with air in order to evacuate the calories;
- the passage of a radial flow of air and of an axial flow of air in order to avoid an overheating of the capacitors and thus prevent damage thereto;
- the resin which allows a good evacuation of the calories of the capacitors towards the second dissipator;
- the presence of openings in the first dissipator for cooling the busbars.

The invention claimed is:

1. A protective covering suitable for covering power, filtering and control blocks of an electronic assembly for a rotary electric machine for a motor vehicle, wherein said protective cover comprises:
    openings suitable for generating different flows of cooling air for thermal dissipation needs of each of the power, control and filtering blocks;
    the openings of the protective cover being divided into:
        a first set of openings suitable for being positioned facing the fins of a first dissipator coupled to the power block;
        a second set of openings suitable for being positioned facing the control block,
        the two sets of openings being separated by a separating low wall so as to create a first radial flow of cooling air for said power block and a second radial flow of cooling air for said control block; and
        a third set of openings positioned facing the fins of a second dissipator coupled to capacitors of the filtering block so as to create a third radial flow of cooling air for said filtering block.

2. The protective cover as claimed in claim 1, wherein the openings of the first set of openings, of the second set of openings and of the third set of openings of the protective cover are lateral, and the openings of the first set of openings and of the second set of openings are arranged in line with the fins of the first dissipator.

3. The protective cover as claimed in claim 1, wherein the fins of the first dissipator, the protective cover and the openings of the first set are arranged in such a way as to satisfy the following relationships:

$$h \geq 0.5 \cdot ha$$

$$H < 0.5 \cdot ha, \text{ and}$$

$$D \geq 0.5 \cdot (d^2 - ((o-e)/2)^2)^{1/2},$$

where h is the height of an opening of the protective cover, ha is the height of a fin of the first dissipator, H is the distance between the bottom of the protective cover and the bottom of an opening, D is the distance between the inner edge of the protective cover and the leading edge of a fin of the first dissipator, d is an inter-fin space separating two adjacent fins of the first dissipator, o is the width of an opening, and e is the thickness of a fin.

4. The protective cover as claimed in claim 1, wherein the protective cover further comprises a fourth set of openings that are arranged on the top of said cover and positioned above capacitors of the filtering block so as to create a fourth axial flow of cooling air for the filtering block.

5. A rotary electric machine comprising:
    a rotor;
    a stator coupled to said rotor and comprising a plurality of phases;
    an electronic assembly comprising:

a power block, a filtering block and a control block,
said power block of said electronic assembly being able to be connected to the phases of said stator, and
a protective cover as claimed in claim 1;
a rear bearing supporting said stator; and
a fan situated in proximity to the rear bearing.

6. The rotary electric machine as claimed in claim 5, wherein said rotary electric machine is a starter alternator.

7. The rotary electric machine as claimed in claim 6, wherein said starter alternator comprises a regenerative braking function and an acceleration assistance function.

\* \* \* \* \*